United States Patent
Shuto

(10) Patent No.: US 7,663,905 B2
(45) Date of Patent: Feb. 16, 2010

(54) FERROELECTRIC MEMORY DEVICE AND DATA READ METHOD IN SAME

(75) Inventor: Susumu Shuto, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 249 days.

(21) Appl. No.: 11/511,212

(22) Filed: Aug. 29, 2006

(65) Prior Publication Data

US 2007/0211512 A1 Sep. 13, 2007

(30) Foreign Application Priority Data

Mar. 7, 2006 (JP) ............................. 2006-061445

(51) Int. Cl.
*G11C 11/22* (2006.01)
(52) U.S. Cl. ...................... 365/145; 365/211
(58) Field of Classification Search .................. 365/145, 365/211
See application file for complete search history.

(56) References Cited

U.S. PATENT DOCUMENTS

| 6,735,546 B2 * | 5/2004 | Scheuerlein ................ 702/132 |
| 6,809,914 B2 * | 10/2004 | Edmonds et al. ........... 361/93.8 |
| 6,937,500 B2 * | 8/2005 | Gudesen et al. ............. 365/145 |

FOREIGN PATENT DOCUMENTS

| JP | 11-20576 | 1/1999 |
| JP | 2000-55746 | 2/2000 |
| JP | 2001-210080 | 8/2001 |
| JP | 2001-332082 | 11/2001 |
| JP | 2003-157203 | 5/2003 |

OTHER PUBLICATIONS

Notification of Reasons for Rejection for Application No. 2006-061445, Japanese Patent Office, mailed Feb. 26, 2008.
Eaton et al., "A Ferroelectric Nonvolatile Memory", IEEE International Solid State Circuit Conference, Digest of Technical Papers, pp. 130, 131 and 329, (1988).

* cited by examiner

*Primary Examiner*—Amir Zarabian
*Assistant Examiner*—Kretelia Graham
(74) *Attorney, Agent, or Firm*—Finnegan, Henderson, Farabow, Garrett & Dunner, L.L.P.

(57) ABSTRACT

A ferroelectric memory device includes a memory cell, read circuit, temperature sensing circuit, and read controller. The memory cell includes a ferroelectric capacitor. The read circuit is configured to read data from the memory cell. The temperature sensing circuit is configured to sense the ambient temperature of the memory cell. The read controller is configured to receive a temperature sensing signal from the temperature sensing circuit, and inhibit a data read operation by the read circuit when the temperature sensed by the temperature sensing circuit is higher than a preset temperature.

16 Claims, 6 Drawing Sheets

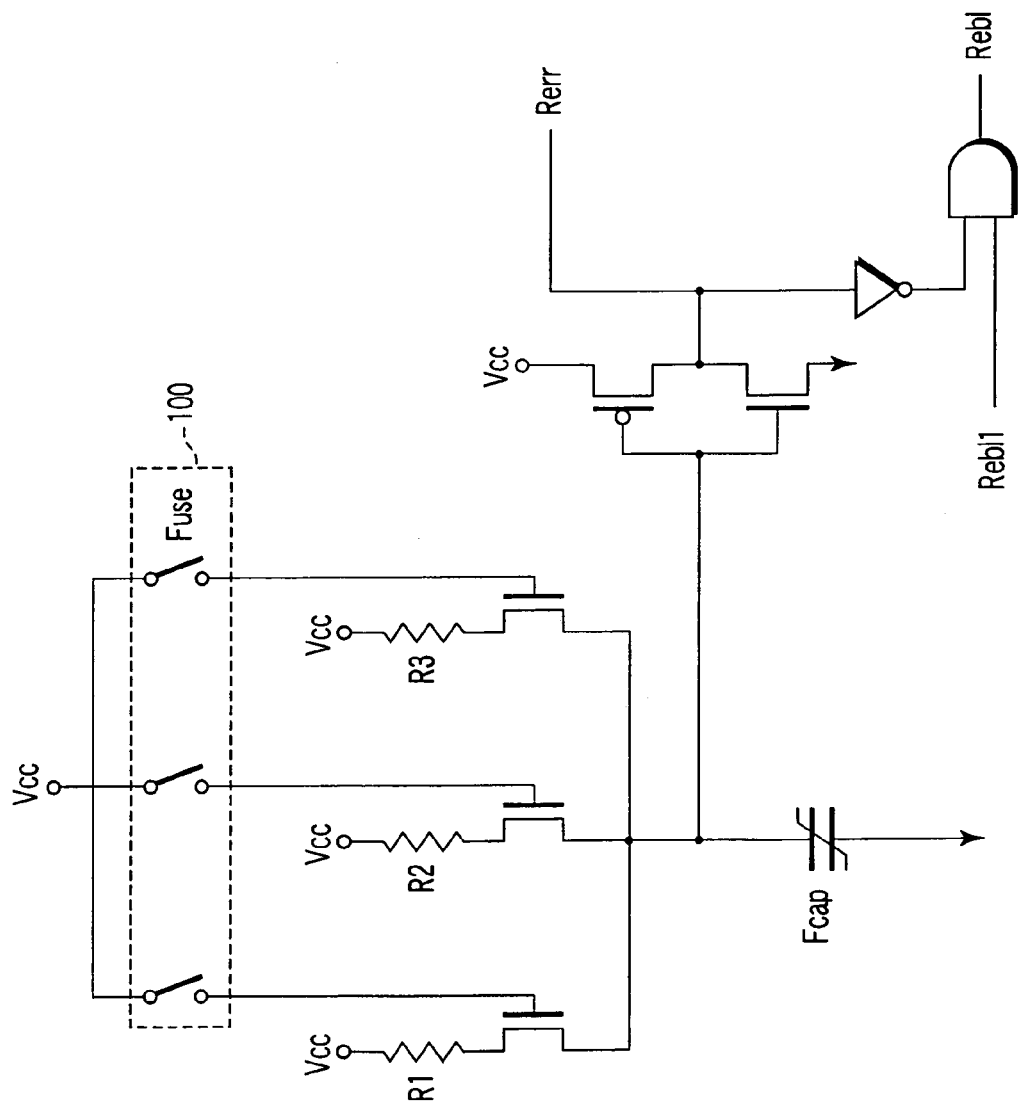
F I G. 10

FERROELECTRIC MEMORY DEVICE AND DATA READ METHOD IN SAME

CROSS-REFERENCE TO RELATED APPLICATIONS

This application is based upon and claims the benefit of priority from prior Japanese Patent Application No. 2006-061445, filed Mar. 7, 2006, the entire contents of which are incorporated herein by reference.

BACKGROUND OF THE INVENTION

1. Field of the Invention

The present invention relates to a data memory device and, more particularly, to a ferroelectric memory device which stores data in a ferroelectric capacitor.

2. Description of the Related Art

A general ferroelectric memory has a cell structure in which data is stored in the ferroelectric capacitor of each cell. Data read is performed by applying a voltage to the ferroelectric material to cause polarization reversal, and sensing a charge amount extracted outside. This charge amount extracted outside is temperature-dependent; the higher the temperature, the smaller the output charge amount. This is so because the spontaneous polarization amount in the ferroelectric material is temperature-dependent.

The relationship between the voltage and polarization of the ferroelectric capacitor has a hysteresis, and the shape of the hysteresis loop of the ferroelectric capacitor at room temperature differs from that at a high temperature. Therefore, the spontaneous polarization amount of the ferroelectric capacitor reduces when the temperature rises.

Accordingly, a signal output from a memory cell of the ferroelectric memory during data read decreases as the temperature rises. If the absolute value of the signal becomes close to the performance limit of a sense amplifier, a read error is highly likely to occur.

In the conventional ferroelectric memory, cell data is read by an external instruction regardless of the device temperature (e.g., S. Sheffield Eaton et al., "A Ferroelectric Nonvolatile Memory", IEEE International Solid State Circuit Conference 1988 Technical Digest p. 130). The conventional ferroelectric memory also has the problem that data is read even when the device temperature is high and a read error may occur (e.g., Jpn. Pat. Appln. KOKAI Publication No. 2001-332082 or 2001-210080).

In addition, since the ferroelectric memory is a destructive read device, wrong data is rewritten if a read error occurs. Accordingly, the memory has the problem that stored data itself may be destroyed, i.e., data which is not destroyed if it is not read may be destroyed.

BRIEF SUMMARY OF THE INVENTION

According to an aspect of the invention, there is provided a ferroelectric memory device comprising: a memory cell comprising a ferroelectric capacitor; a read circuit configured to read data from the memory cell; a temperature sensing circuit configured to sense an ambient temperature of the memory cell; and a read controller configured to receive a temperature sensing signal from the temperature sensing circuit, and inhibit a data read operation by the read circuit when the temperature sensed by the temperature sensing circuit is higher than a preset temperature.

According to another aspect of the present invention, there is provided a data read method in a ferroelectric memory device comprising a memory cell which comprises a ferroelectric capacitor, a read circuit configured to read data from the memory cell, and a temperature sensing circuit configured to sense an ambient temperature of the memory cell, comprising: receiving a read signal which designates data read from the memory cell from external; determining whether a temperature sensed by the temperature sensing circuit is higher than a preset temperature; and inhibiting a data read operation by the read circuit when the sensed temperature is higher than the preset temperature.

BRIEF DESCRIPTION OF THE SEVERAL VIEWS OF THE DRAWING

FIG. 10 is a circuit diagram showing the arrangement of a temperature sensing circuit and read controller capable of adjusting the set temperature after fabrication according to the embodiment of the present invention.

DETAILED DESCRIPTION OF THE INVENTION

An embodiment of the present invention will be described in detail below with reference to the accompanying drawing.

Figure 1:
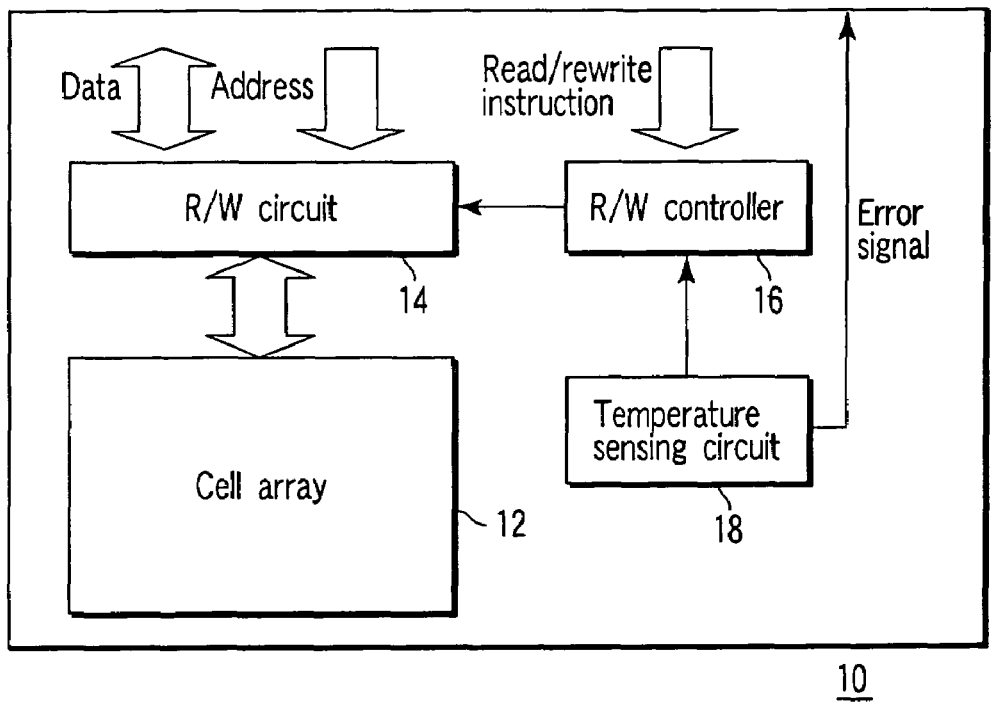
FIG. 1 is a block diagram showing the arrangement of a ferroelectric memory device according to an embodiment of the present invention.

FIG. 1 is a block diagram showing the arrangement of a ferroelectric memory device according to the embodiment of the present invention.

Figure 2:
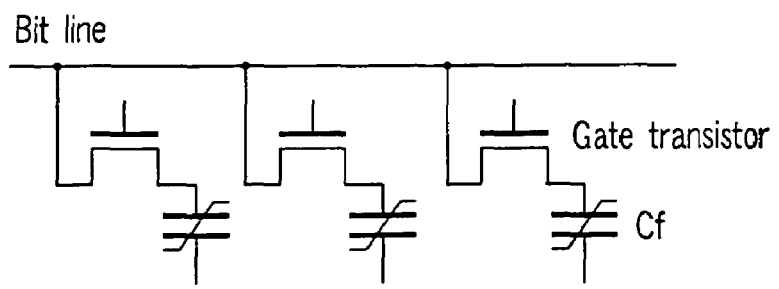
FIG. 2 is a circuit diagram showing the arrangement of a cell array in the ferroelectric memory device according to the embodiment of the present invention.

As shown in FIG. 1, a ferroelectric memory device 10 of the present invention comprises a cell array 12, read/write(R/W) circuit 14, R/W controller 16, and temperature sensing circuit 18. In the cell array 12, memory cells each having a ferroelectric capacitor as shown in FIG. 2 are arranged in the form of an array. The whole ferroelectric memory device 10 can be mounted on a single chip.

The R/W circuit 14 executes read and rewrite of the cell array 12. The ferroelectric memory is a destructive read device. After data read, therefore, rewrite must be performed to hold the read data in the cell array 12 again. The R/W controller 16 controls the R/W circuit 14 by receiving an external read/rewrite instruction and a signal from the temperature sensing circuit 18. The temperature sensing circuit 18 includes a temperature sensor (not shown) capable of sensing the ambient temperature of the cell array. A signal from the temperature sensing circuit 18 is input to the R/W controller 16.

The operation of the ferroelectric memory device according to the embodiment of the present invention will be explained below.

The temperature sensing circuit 18 determines by the signal from the temperature sensor whether the ambient temperature of the cell array is higher than a preset temperature. The temperature sensing circuit 18 then supplies a signal indicating the determination result to the R/W controller 16. The R/W controller 16 receives this signal, and, if the ambient temperature of the cell array is equal to or lower than the preset temperature, directly transmits an external read/rewrite instruction to the R/W circuit 14.

In other words, if the ambient temperature of the cell array is higher than the preset temperature, the R/W controller 16 disables the R/W circuit 14 for a read/rewrite operation even when receiving an external read/rewrite instruction.

The temperature sensing circuit 18 can sense the temperature at all times or only when a read/rewrite instruction is externally supplied to the R/W controller 16. The circuit configuration is simpler when temperature sensing is always executed. To save the power consumption, however, temperature sensing is preferably performed only when a read/rewrite instruction is supplied. In the latter case, a signal line for notifying the temperature sensing circuit 18 that a read/rewrite instruction is externally supplied is formed to allow the temperature sensing circuit 18 to sense the temperature when a read/rewrite instruction is supplied.

If the temperature sensing circuit 18 determines by the signal from the temperature sensor that the ambient temperature of the cell array is higher than the preset temperature, it outputs an error signal outside, and supplies a signal which causes the R/W controller 16 to ignore an external read/rewrite instruction. The error signal can be output to an error signal output node formed on the chip which forms the ferroelectric memory device 10, or can be expressed as a combination of outputs to several nodes.

Figure 3:
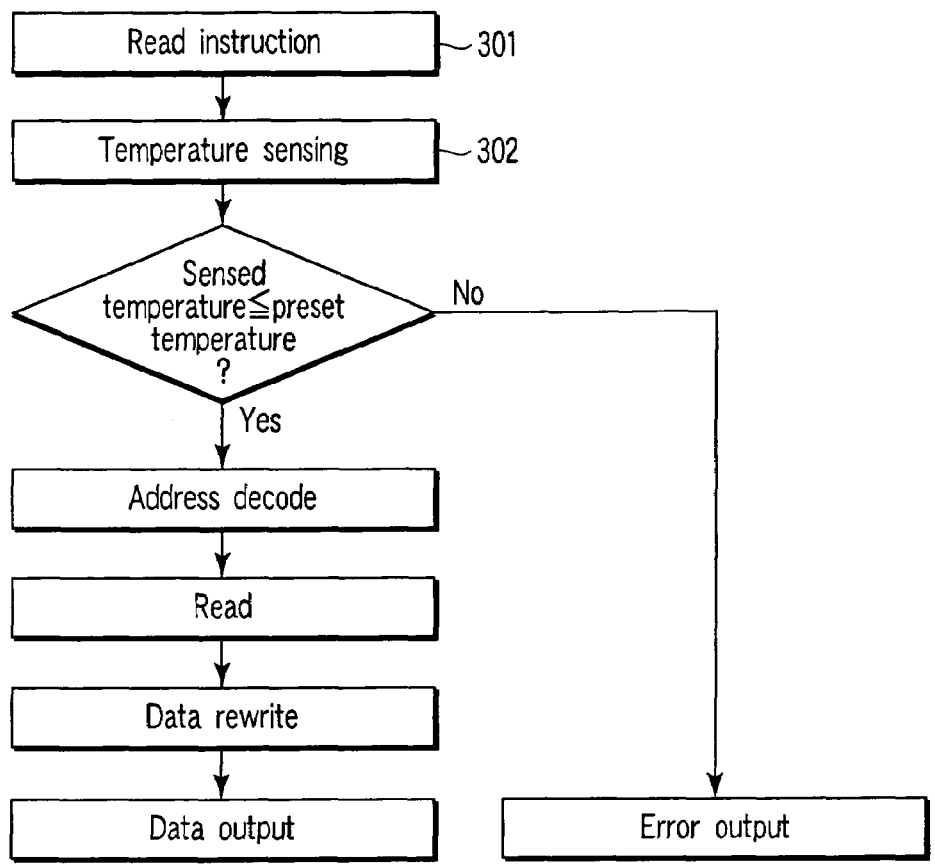
FIG. 3 is a flowchart of a read sequence in the ferroelectric memory device according to the embodiment of the present invention.

FIG. 3 is a flowchart of a read sequence in the ferroelectric memory device according to this embodiment explained above. As shown in FIG. 3, in the ferroelectric memory device of this embodiment, whether to perform an actual read operation is determined on the basis of the result of sensing of the ambient temperature of the cell array. Note that if temperature sensing is always executed, the step of "temperature sensing" (step 302) after "read instruction" (step 301) shown in FIG. 3 need not be described.

Figure 4:
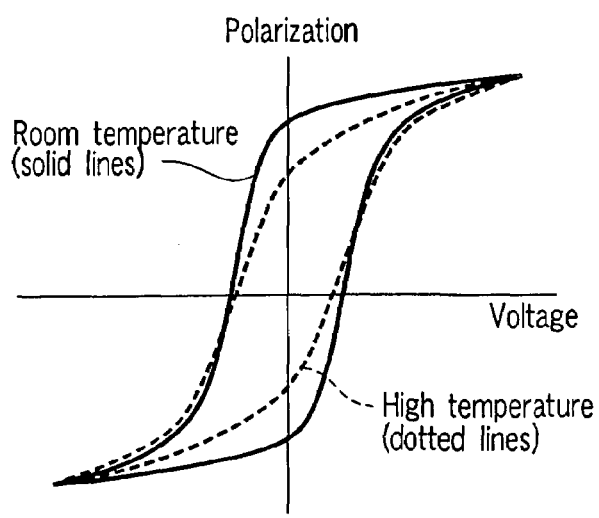
FIG. 4 is a graph showing the relationship between the voltage and polarization of a ferroelectric capacitor.
Figure 5:
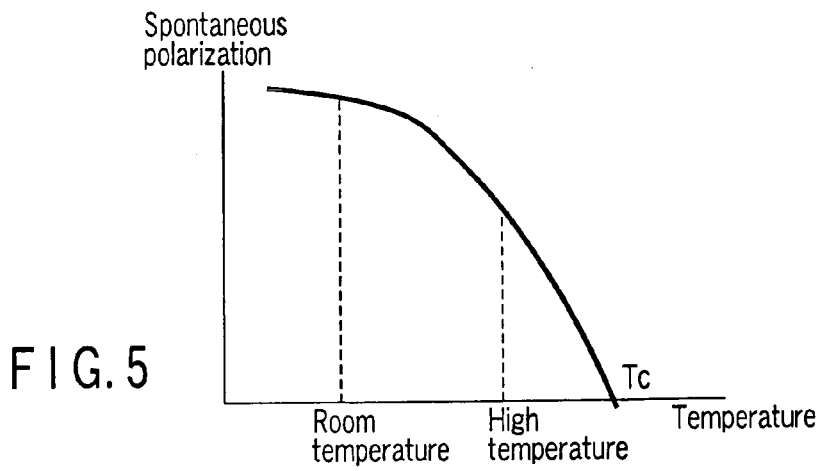
FIG. 5 is a graph showing the relationship between the temperature and spontaneous polarization amount of the ferroelectric capacitor.
Figure 6:
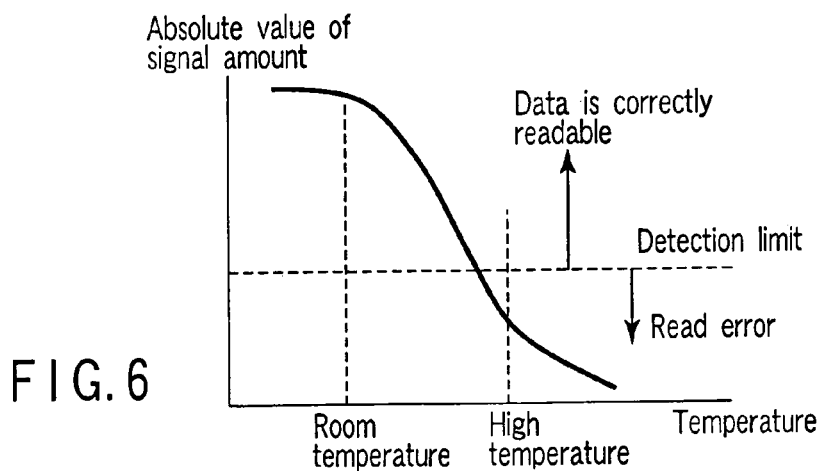
FIG. 6 is a graph showing the relationship between the absolute value of a signal amount in a read operation and the temperature of the ferroelectric capacitor.

The relationship between the voltage and polarization of the ferroelectric capacitor has a hysteresis as shown in FIG. 4. The polarization amount at zero voltage in FIG. 4 is a spontaneous polarization amount. When the temperature rises, a hysteresis loop indicated by the dotted lines is obtained, and the spontaneous polarization amount reduces. This is clearly indicated by FIG. 5 which shows the relationship between the temperature and spontaneous polarization amount. A temperature at which the spontaneous polarization amount is zero is a phase transition temperature $T_C$ of the ferroelectric material. Also, FIG. 6 which corresponds to FIG. 5 shows the relationship between the absolute value of a signal amount in a read operation and the temperature. Accordingly, the preset temperature described above can be determined as a temperature lower than the phase transition temperature at which the ferroelectric material loses its properties, by taking account of the relationship shown in FIG. 6 which depends on, e.g., the characteristics of the ferroelectric material used and the detection limit of the detector.

A phenomenon in which the spontaneous polarization amount decreases at a high temperature is a reversible phenomenon. Therefore, large spontaneous polarization appears again if the temperature of the ferroelectric material is returned from a high temperature to a low temperature. That is, even if spontaneous polarization decreases at a high temperature, correct data is kept stored as long as the data is not read at a high temperature, and can be read when the temperature is returned to room temperature.

Accordingly, data is not read if a read error may occur due to a rise in device temperature as in the ferroelectric memory device according to this embodiment of the present invention. This can solve the problem that wrong data is rewritten due to a read error, i.e., data which is not destroyed if it is not read is destroyed.

Note that the accuracy of the operation of normal data write (not rewrite) becomes unstable at a high temperature, so a message indicating that the operation is not guaranteed may also be output.

Figure 7:
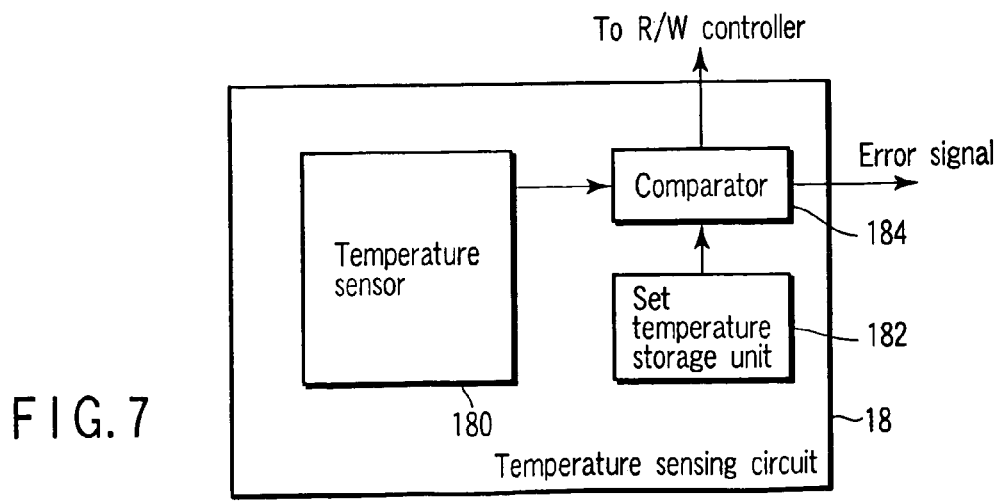
FIG. 7 is a block diagram showing the arrangement of a temperature sensing circuit according to the embodiment of the present invention.

The temperature sensing circuit 18 can be any circuit as long as it includes a mechanism capable of sensing the temperature of the ferroelectric capacitor forming the cell array 12. As shown in FIG. 7, a possible basic configuration includes a temperature sensor 180, set temperature storage unit 182, and comparator 184.

The comparator 184 compares the temperature measured by the temperature sensor 180 with a preset temperature stored in the set temperature storage unit 182. If the temperature measured by the temperature sensor 180 is higher than the preset temperature, the comparator 184 supplies a signal which causes the R/W controller 16 to ignore an external read/rewrite instruction. At the same time, the comparator 184 outputs an error signal.

In this embodiment, it is assumed that the temperature measured by the temperature sensor 180 substantially matches the actual temperature of the ferroelectric capacitor forming the cell array 12. However, these two temperatures do not strictly match in some cases. Accordingly, it is also possible to calibrate, in a final test step or the like of the fabrication process, the difference between the temperature preset in accordance with, e.g., the characteristics of the ferroelectric material used and the detection limit of the detector and the temperature measured by the temperature sensor at that time, and store the calibrated set temperature in the set temperature storage unit 182.

Figure 8:
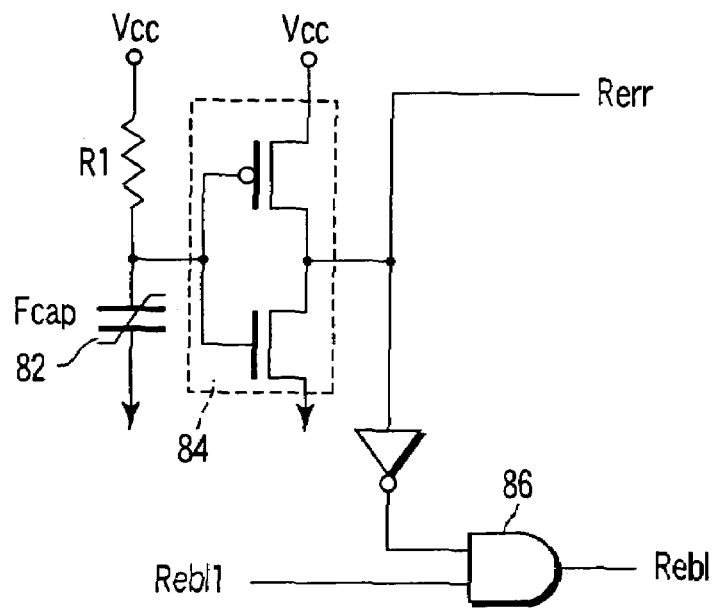
FIG. 8 is a circuit diagram showing the arrangement of the temperature sensing circuit and a read controller accordingly to the embodiment of the present invention.

In addition, it is possible to implement an embodiment of a temperature sensing circuit and read controller as shown in FIG. 8 by using a ferroelectric capacitor in temperature sensing. Generally, a ferroelectric capacitor decreases the resistance and increases the leakage current at a high temperature. The leakage current sometimes increases several orders of magnitude when the temperature rises from room temperature to 125° C., and this presumably facilitates sensing. The temperature sensing circuit shown in FIG. 8 senses the temperature by using this characteristic.

When the temperature is around room temperature which is equal to or lower than a predetermined temperature threshold value, the resistance of a ferroelectric capacitor 82 is high. Accordingly, the input to an inverter 84 in the next stage has a potential close to a power supply voltage Vcc in accordance with the resistance dividing ratio with respect to R1. As a consequence, the output from the inverter 84 is "0", and the final input to an AND circuit 86 is "1". In this case, a read instruction signal (Rebl1: Read enable 1) is directly output to the output (Reb1) of the AND circuit 86.

By contrast, when the temperature is higher than the predetermined temperature threshold value described above, the ferroelectric capacitor 82 decreases the resistance and increases the leakage current. Therefore, the input to the inverter 84 is close to 0V, so the final input to the AND circuit 86 is "0". In this case, no data read occurs because the output (Reb1) from the AND circuit 86 is "0" regardless of the value of the read instruction signal (Rebl1). In this case, the output signal from the inverter 84 is "1", and this signal is output outside as a read error signal (Rerr). In this embodiment, the temperature threshold value equivalent to the preset temperature is physically determined as a characteristic of the ferroelectric capacitor.

Figure 9:
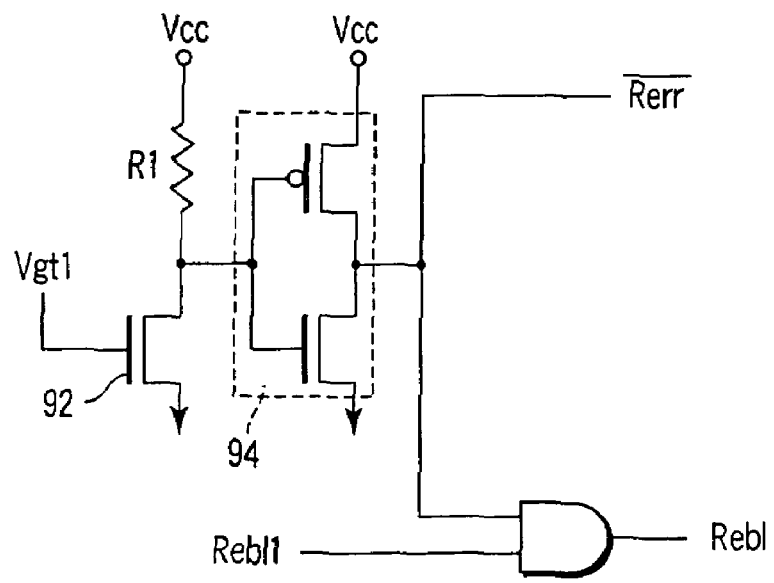
FIG. 9 is a circuit diagram showing another arrangement of the temperature sensing circuit and read controller according to the embodiment of the present invention.

FIG. 9 shows another embodiment of the temperature sensing circuit and read controller. In this embodiment, temperature sensing is performed using a transistor 92. That is, this embodiment uses the characteristic that the threshold voltage, i.e., the resistance of the transistor 92 increases at a high temperature. In this embodiment, the input to an inverter 94 is close to 0V at a low temperature and close to Vcc at a high temperature, so the logic is the inverse of the circuit shown in FIG. 8. However, the concept of the circuit operation is basically the same as described above with reference to FIG. 8.

It is also possible to use the change in bandgap of silicon (Si) with the temperature or the change in resistance of a polysilicon interconnection with the temperature in the arrangements shown in FIGS. 8 and 9. The temperature threshold value is physically determined in these cases as well.

When an element having a resistance value which changes with the temperature is used in temperature sensing as described above, the leakage current characteristic of a ferroelectric capacitor and the like probably vary due to the variations in fabrication in the actual fabrication process. Accordingly, it is unrealistic to determine the preset temperature described above by using a single resistor and a single ferroelectric capacitor as shown in FIG. 8.

Figure 11:
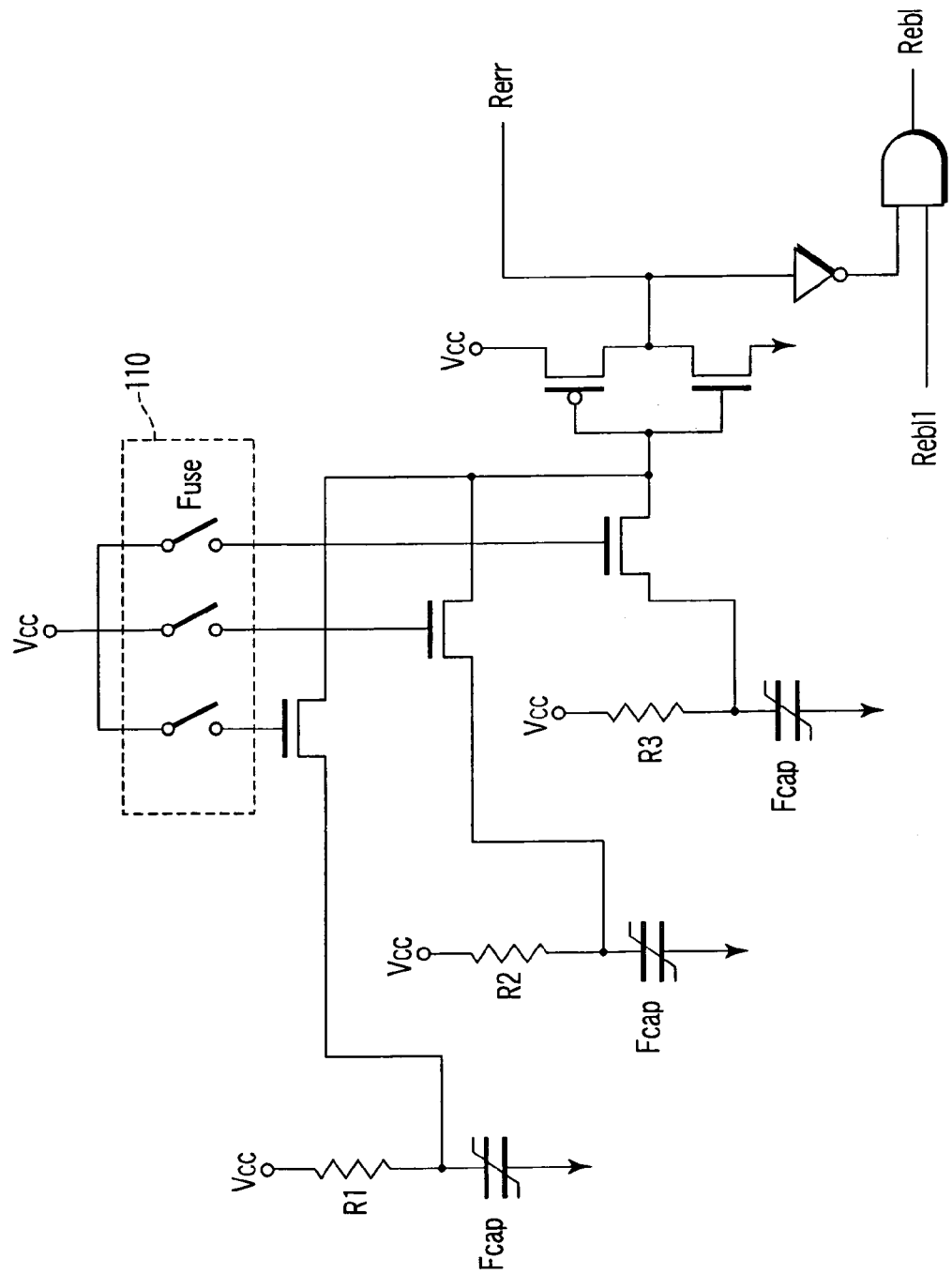
FIG. 11 is a circuit diagram showing another arrangement of the temperature sensing circuit and read controller capable of adjusting the set temperature after fabrication according to the embodiment of the present invention.

It is, therefore, possible to implement an embodiment in which the set temperature of a temperature sensing circuit can be adjusted after device fabrication by using an arrangement as shown in FIG. 10 or 11. That is, it is possible to adjust the set temperature and determine an optimum value on the basis of the test results after fabrication by selectively or, alternatively closing switches of a fuse 100 or 110.

FIG. 10 shows an embodiment of a temperature sensing circuit and read controller having a plurality of resistors ($R_1$, $R_2$, and $R_3$) connected in parallel to one ferroelectric capacitor, and a fuse 100 including a plurality of switches capable of switching whether to use the corresponding resistors.

When the switches of the fuse 100 are selectively or alternatively closed, the current supply paths from the power supply to the ferroelectric capacitor are selectively or alternatively connected. In other words, the value of the resistance connecting the power supply and ferroelectric capacitor changes in accordance with the switching of the switches. Accordingly, the resistance dividing ratio changes at the same temperature, and this changes the input potential to an inverter in the next stage. As a consequence, the set temperature can be adjusted.

FIG. 11 shows another arrangement of the temperature sensing circuit and read circuit capable of adjusting the set temperature after fabrication. This embodiment uses a plurality of temperature sensors each of which includes one resistor and one ferroelectric capacitor, i.e., each of which is the temperature sensor used in the embodiment shown in FIG. 8.

The embodiment further comprises a fuse 110 including a plurality of switches capable of switching whether to use the corresponding temperature sensors. The set temperature can be adjusted by alternatively closing these switches.

The arrangement as shown in FIG. 10 or 11 makes it possible to finely set the set temperature for operating the read circuit in accordance with the fabrication variations of products, even when an element such as a ferroelectric capacitor which changes the resistance value with the temperature is used in temperature sensing.

One aspect of the present invention can provide a ferroelectric memory device using a read method having high data holding reliability.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A ferroelectric memory device comprising:
a memory cell comprising a ferroelectric capacitor;
a read circuit configured to read data from the memory cell;
a temperature sensing circuit configured to sense an ambient temperature of the memory cell; and
a read controller configured to receive a temperature sensing signal from the temperature sensing circuit, and inhibit a data read operation by the read circuit when the temperature sensed by the temperature sensing circuit is higher than a preset temperature;
wherein the preset temperature is lower than a phase transition temperature of a ferroelectric material forming the ferroelectric capacitor.

2. A device according to claim 1, further comprising:
an output node which outputs an error signal for notifying an external device that the data read operation by the read circuit is inhibited,
wherein if the temperature sensed by the temperature sensing circuit is higher than the preset temperature, the temperature sensing signal output from the temperature sensing circuit is output as the error signal from the output node.

3. A device according to claim 1, wherein the temperature sensing circuit comprises an element which changes a resistance value with a temperature, a current supply circuit configured to supply an electric current to the element, and a potential sensing circuit configured to sense an electric potential of one electrode of the element.

4. A device according to claim 1, wherein the read controller comprises a logic circuit which receives the temperature sensing signal and a read signal.

5. A device according to claim 3, wherein the element comprises a ferroelectric capacitor.

6. A device according to claim 3, wherein the element comprises a transistor, the current supply circuit comprises a power supply and a resistor, and the potential sensing circuit comprises an inverter.

7. A device according to claim 3, wherein the element comprises a polysilicon interconnection, the current supply circuit comprises a power supply and a resistor, and the potential sensing circuit comprises an inverter.

8. A device according to claim 3, wherein the current supply circuit further comprises a switch which supplies different electric currents to the element by selecting a plurality of current supply paths.

9. A device according to claim 5, wherein the current supply circuit comprises a power supply and a resistor, and the potential sensing circuit comprises an inverter.

10. A device according to claim 1, wherein the temperature sensing circuit comprises a plurality of elements each of which changes a resistance value with a temperature, a plurality of current supply circuits configured to supply electric currents to said plurality of elements, a switch which selects one electrode of one of said plurality of elements, and a potential sensing circuit configured to sense a potential of the selected electrode.

11. A device according to claim 2, wherein the temperature sensing circuit comprises an element which changes a resistance value with a temperature, a current supply circuit configured to supply an electric current to the element, and an inverter which receives a potential of one electrode of the element, an output signal from the inverter is output as the error signal from the output node, and the read controller comprises a logic circuit which receives the output signal from the inverter and the read signal.

12. A device according to claim 5, wherein the current supply circuit further comprises a switch which supplies different electric currents to the element by selecting a plurality of current supply paths.

13. A device according to claim 12, wherein said plurality of current supply paths extend via resistors different in resistance value.

14. A device according to claim 11, wherein the element comprises a ferroelectric capacitor, and the logic circuit comprises an AND circuit including an input terminal connected to an inverter.

15. A device according to claim 11, wherein the element comprises a transistor, and the logic circuit comprises an AND circuit.

16. A device according to claim 1, wherein the temperature sensing circuit comprises a temperature sensor which measures an ambient temperature of the memory cell, a set temperature storage unit which stores the preset temperature, and a comparator which is connected to the temperature sensor and the set temperature storage unit and compares the ambient temperature of the memory cell with the preset temperature.

\* \* \* \* \*